(12) United States Patent
Jaszcar et al.

(10) Patent No.: US 10,358,713 B2
(45) Date of Patent: Jul. 23, 2019

(54) SURROUNDING FIELD SPUTTERING SOURCE

(71) Applicant: Kurt J. Lesker Company, Clairton, PA (US)

(72) Inventors: Matthew Jaszcar, Bethel Park, PA (US); Robert M. Belan, South Park, PA (US); Kurt John Lesker, III, Bethel Park, PA (US)

(73) Assignee: Kurt J. Lesker Company, Clairton, PA (US)

( * ) Notice: Subject to any disclaimer, the term of this patent is extended or adjusted under 35 U.S.C. 154(b) by 0 days.

(21) Appl. No.: 15/129,195

(22) PCT Filed: Apr. 20, 2015

(86) PCT No.: PCT/US2015/026659
§ 371 (c)(1),
(2) Date: Sep. 26, 2016

(87) PCT Pub. No.: WO2015/164257
PCT Pub. Date: Oct. 29, 2015

(65) Prior Publication Data
US 2017/0175251 A1 Jun. 22, 2017

Related U.S. Application Data

(60) Provisional application No. 61/981,935, filed on Apr. 21, 2014.

(51) Int. Cl.
*C23C 14/35* (2006.01)
*C23C 14/34* (2006.01)
*H01J 37/34* (2006.01)

(52) U.S. Cl.
CPC .......... *C23C 14/3407* (2013.01); *C23C 14/35* (2013.01); *H01J 37/342* (2013.01); *H01J 37/3402* (2013.01); *H01J 37/3405* (2013.01); *H01J 37/3423* (2013.01); *H01J 37/3429* (2013.01); *H01J 37/3452* (2013.01); *H01J 37/3461* (2013.01)

(58) Field of Classification Search
CPC ...................................... H01J 37/342
See application file for complete search history.

(56) References Cited

U.S. PATENT DOCUMENTS

| | | | | |
|---|---|---|---|---|
| 4,221,652 A | * | 9/1980 | Kuriyama | H01J 37/3405 204/192.12 |
| 4,407,713 A | | 10/1983 | Zega | |
| 2004/0074770 A1 | * | 4/2004 | Wityak | B65G 3/00 204/298.14 |
| 2004/0163943 A1 | * | 8/2004 | Rietzel | H01J 37/3405 204/192.12 |
| 2004/0206620 A1 | * | 10/2004 | Wang | C23C 14/3407 204/192.12 |
| 2007/0017799 A1 | | 1/2007 | Guo | |
| 2007/0295596 A1 | | 12/2007 | Inagawa et al. | |
| 2010/0155226 A1 | | 6/2010 | Madocks et al. | |

* cited by examiner

*Primary Examiner* — Jason Berman
(74) *Attorney, Agent, or Firm* — The Webb Law Firm (57) ABSTRACT

A sputtering cathode includes a magnet having a body of length L1 defining a north magnetic pole at a first end of the body and a south magnetic pole at a second, opposite end of the body. A sputtering target of length L2 surrounds the body of the magnet, but not ends of the magnet.

20 Claims, 6 Drawing Sheets

SECTION ID - ID
FIG. 1D

SECTION IV D - IV D
FIG. 4D

FIG. 5

SURROUNDING FIELD SPUTTERING SOURCE

CROSS REFERENCE TO RELATED APPLICATIONS

This application is the U.S. national phase of International Application No. PCT/US2015/026659 filed Apr. 20, 2015, and claims priority to U.S. Provisional Patent Application No. 61/981,935 filed Apr. 21, 2014, the disclosures of which are hereby incorporated in their entirety by reference.

BACKGROUND OF THE INVENTION

Field of the Invention

The present invention relates to a sputtering cathode, a method of forming the sputtering cathode, and a physical vapor deposition system that utilizes the sputtering cathode.

Description of Related Art

Traditional sputtering cathodes utilize only a small part of the magnetic field in the form of a small arc generated by the permanent magnets of their magnet assemblies. These field lines penetrate through the material of the sputtering target to produce a small fraction of the magnetic field that is truly parallel to the face of the sputtering target.

It has been observed that magnetic field lines that are parallel to and above the face of the sputtering target are the field lines responsible for electron trapping and thus concentration of the sputtering plasma. Accordingly, it is desirable to enhance the number and/or length of magnetic field lines of a sputtering cathode that run parallel (or substantially parallel) to and above the face of the sputtering target in order to maximize electron trapping and concentration of the sputtering plasma.

SUMMARY OF THE INVENTION

Disclosed herein is an example sputtering cathode that utilizes the entire magnetic field that surrounds the sputtering target. This magnetic field is brought about by an arrangement of one or more magnets to produce an azimuthal magnetic field that surrounds the entire outward facing surface of the sputtering target, i.e., the surface of the target to be sputtered. Advantages of the sputtering cathode disclosed herein over a traditional sputtering cathode is that the magnetic field lines are not required to (but can) penetrate the surface of the sputtering target. Rather, the magnetic field lines form around/along the entire outward facing surface of the sputtering target with little or no penetration of the surface of the sputtering target.

Various preferred and non-limiting examples of the present invention will now be described and set forth in the following numbered clauses:

Clause 1: In an example, a sputtering cathode comprises: a magnet having a body of length L1 defining a north magnetic pole at a first end of the body and a south magnetic pole at a second, opposite end of the body; and a sputtering target of length L2 surrounding the body of the magnet, but not ends of the magnet.

Clause 2: The sputtering cathode of clause 1, wherein: magnetic field lines produced by the magnet extend in a direction of length L2 along an outward facing surface of the sputtering target.

Clause 3: The sputtering cathode of clause 1 or 2, wherein (0.75·L1)≤L2≤L1.

Clause 4: The sputtering cathode of any one of clauses 1-3, wherein: the sputtering target is made from a single material.

Clause 5: The sputtering cathode of any one of clauses 1-4, wherein: the sputtering target is comprised of multiple pieces of material; and each piece is comprised of the same material.

Clause 6: The sputtering cathode of any one of clauses 1-5, wherein: the sputtering target is comprised of multiple pieces of material; and each piece is comprised of a different material.

Clause 7: The sputtering cathode of any one of clauses 1-6, further including a plurality of magnets surrounded by the sputtering target Clause 8: The sputtering cathode of any one of clauses 1-7, wherein: the north magnetic poles of the plurality of magnets are oriented facing a first direction; and the south magnetic poles of the plurality of magnets are oriented facing a second, opposite direction.

Clause 9: The sputtering cathode of any one of clauses 1-8, wherein the plurality of magnets is positioned side-by-side in spaced relation, in a plane.

Clause 10: The sputtering cathode of any one of clauses 1-9, wherein longitudinal axes of the plurality of magnets extend in the same direction.

Clause 11: The sputtering cathode of any one of clauses 1-10, wherein longitudinal axes of the plurality of magnets are parallel.

Clause 12: The sputtering cathode of any one of clauses 1-11, wherein, when viewed from one of pole ends of the plurality of magnets, the plurality of magnets is positioned in one of: a plane; a circle; a rectangle, a square, a triangle, or a polygon.

Clause 13: The sputtering cathode of any one of clauses 1-12, further including a former between the magnet and the sputtering target.

Clause 14: The sputtering cathode of any one of clauses 1-13, further including a cooling tube for passing fluid into the sputtering cathode, out from the sputtering cathode, or through the sputtering cathode.

Clause 15: The sputtering cathode of any one of clauses 1-14, wherein the cooling tube extends through the sputtering cathode in the same direction as a longitudinal axis of the magnet.

Clause 16: The sputtering cathode of any one of clauses 1-15, wherein, in cross-section, the sputtering target has one of the following shapes: oblong, oval, racetrack, round, polygon, hexagon, triangle, rectangle, or square.

Clause 17: In an example, a method of forming a sputtering cathode comprises: (a) providing a magnet of axial length L1 defining north and south magnetic poles at opposite ends of the length L1; and (b) surrounding an axis of the magnet, but not the ends of the magnet, with a sputtering target of length L2.

Clause 18: The method of clause 17, wherein (0.75·L1) ≤L2≤L1.

Clause 19: The method of clause 17 or 18, wherein magnetic field lines produced by the magnet extend in a direction of length L2 along an outward facing surface of the sputtering target.

Clause 20: In an example physical vapor deposition system comprises: an enclosure; the sputtering cathode of any one of clauses 1-17 in the enclosure; and a power supply having a negative terminal connected to the sputtering cathode, wherein the enclosure is connected to a positive terminal of the power supply or to a reference ground and operates as an anode of the system.

DETAILED DESCRIPTION OF THE INVENTION

The present invention will be described with reference to the accompanying figures where like reference correspond to like or similar elements.

Disclosed herein are examples of sputtering cathodes that utilize the distribution of magnetic flux or magnetic field from one or more magnets to create an electron trap around the sputtering cathode and/or around all externally facing sides or surfaces of the sputtering cathode.

In contrast to traditional planar sputtering cathode arrangements, the magnetic flux or field lines produced by the disclosed sputtering cathodes run longitudinal to the sputtering target's outward facing surface (i.e., run along the outward facing surface of the sputtering target of the sputtering cathode) and may or may not penetrate this outward facing surface. The magnetic field lines of the disclosed sputtering cathodes cause electrons to loop around the magnetic field lines thereby significantly increasing the path of the electrons to ground versus traditional planar sputtering cathode arrangements. The longer the electrons are resident in the magnetic field lines, the more likely these electrons will undergo collisions with process gas and produce ions. There is also drift current that naturally directs electrons toward an anode of a physical vapor deposition (PVD) system that uses the sputtering cathode to complete the electrical circuit between the sputtering cathode and the anode.

In an example PVD system, the anode can be a wall of the PVD system. In another example, one or more standalone anodes can be disposed in the enclosure of a PVD system apart from the wall of the PVD system. In an example, the disclosed sputtering cathode does not have an active anode surrounding it. Rather, the anode can be the vacuum chamber of the PVD system or other fixtures of the vacuum chamber biased to a suitable anode potential. As a result, electrons are required to clear the magnetic field lines surrounding the sputtering cathode before being released to the anode potential. Accordingly, in an example, the combination of longitudinal magnetic field lines running along the outward facing surface of the sputtering target and the distant proximity of the anode (relative to an anode used with a conventional planar sputtering cathode arrangement) enables the disclosed sputtering cathode to efficiently use electrons caught in its magnetic field.

The pressure at which the disclosed sputtering cathode can run is believed to be a function of the electron density found in the magnetic field of the sputtering cathode directly above the face of the sputtering target of the sputtering cathode. In this regard, it is believed that the more electrons that are captured and the length of time that these electrons are retained within the magnetic field, the lower in vacuum pressure the disclosed sputtering cathode can run. More specifically, it is believed that the combination of longitudinal magnetic field lines that run completely around the outward facing surface of the disclosed sputtering target, along with the remote proximity of an anode of a PVD system that utilizes the disclosed sputtering cathode enables the PVD system to run at lower sputtering pressures than the same PVD system would run when utilizing a traditional planar sputtering cathode. In an example, a PVD system utilizing the disclosed sputtering cathode was observed to run at sputtering pressures ≤ one order of magnitude less than the sputtering pressures of the same PVD system when utilizing a traditional planar sputtering cathode. The observation was surprising and unexpected.

With reference to FIGS. 1A-1E, in an example, sputtering cathode 2 includes a magnetic field structure in the form of one or more elongated magnets 4 of length L1. Each magnet 4 includes north and south magnetic poles at opposite ends of the elongated body that defines magnet 4. In an example, the one or more magnets 4 can be inserted into a former 5 in spaced relation, with the north pole of each magnet 4 at one end of former 5 and with the south pole of each magnet 4 at the other end.

Figure 2A:
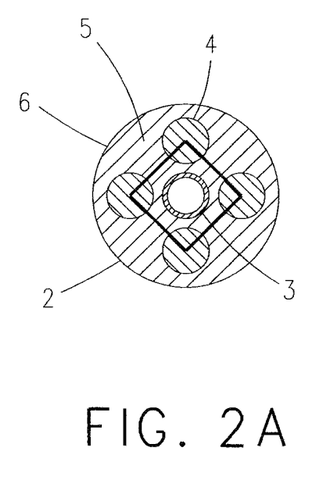
FIGS. 2A-2D are cross sections of different embodiment sputtering cathodes having a round shape, a polygon or hexagonal shape, a triangular shape, and a square shape, respectively, including magnets (e.g., permanent magnets) positioned in a circle, polygon or hexagonal shape (FIG. 2B), a rectangle or square (FIGS. 2A, 2D), or a triangle (FIG. 2C)
Figure 2B:
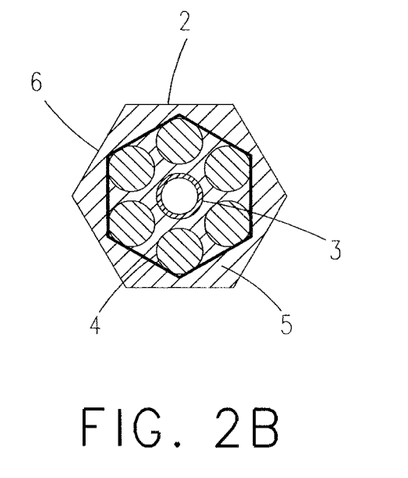
Figure 2C:
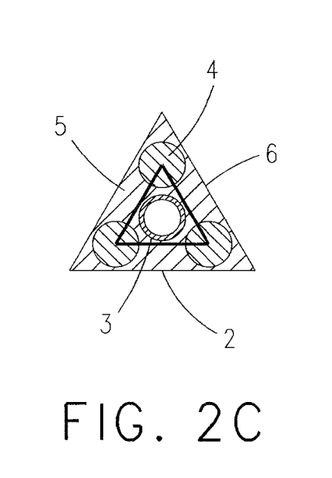
Figure 2D:
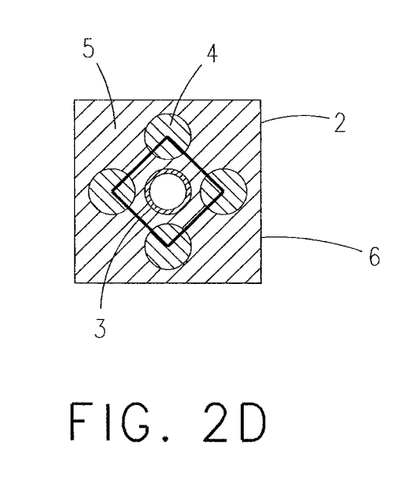

In an example, former 5, in cross-section, can have an oblong, oval, racetrack, round, polygon, hexagonal, triangle, rectangle, or square shape that houses magnets 4, thereby forming elongated sputtering cathode 2 having an oblong, oval, racetrack, round, polygon, hexagonal, triangle, rectangle, or square shape. It is to be appreciated, however, that sputtering cathode 2 can have any suitable and/or desirable combination of flat and/or arcuate/curved surfaces. An example of a cross-section of a round sputtering cathode 2 is shown in FIG. 2A. An example of a cross-section of a polygon, e.g., hexagonal, sputtering cathode 2 is shown in FIG. 2B. An example of a cross-section of a triangular sputtering cathode 2 is shown in FIG. 2C. Finally, an example of a cross-section of a square or rectangular sputtering cathode 2 is shown in FIG. 2D.

Sputtering cathode 2 also includes an elongated sputtering target 6 of length L2 surrounding the elongated body of the one or more magnets 4, but not the ends of the one or more magnets 4. In an example, L2≤L1. In another example, 0.75×L1≤L2≤L1.

In an example, magnetic field lines 8 produced by the one or more magnets 4 extend from each magnet's 4 north pole in a direction of length L1 over the elongated length L2 along an outward facing surface of sputtering target 6 and return or close on the south pole of the magnet 4. In an example, the magnetic field lines produced by the one or more magnets 4 produce an azimuthal magnetic field that surrounds the entire outward facing surface of the sputtering target 6. In an example, the magnetic field lines are not required to (but can) penetrate the surface of the sputtering target 6 forming sputtering cathode 2. Rather, the magnetic field lines 8 form around the entire outward facing surface of the sputtering target 6 with little or no penetration of the magnetic field lines into the surface of the sputtering target 6.

Figure 1A:
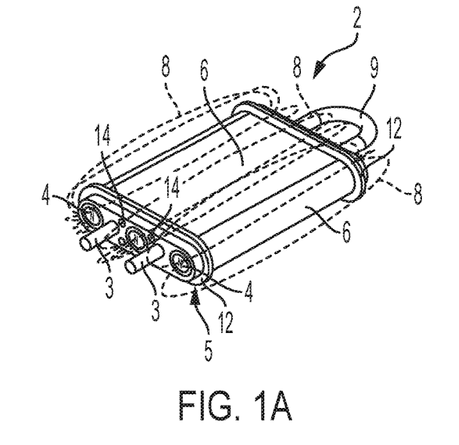
FIG. 1A is a perspective view of a first embodiment sputtering cathode in accordance with the present invention.
Figure 1B:
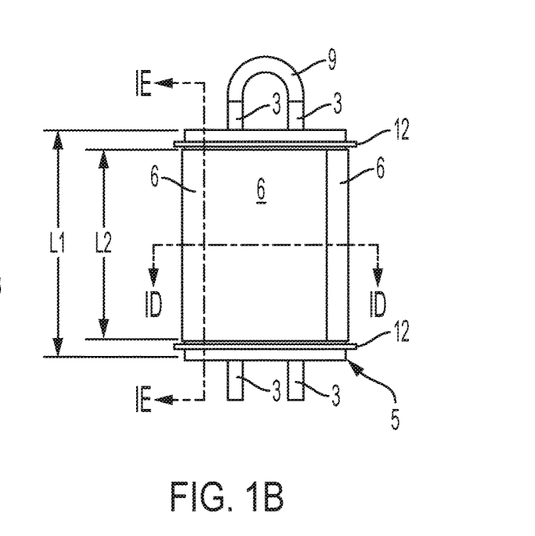
FIG. 1B is a plan view of the sputtering cathode of FIG. 1A.
Figure 1C:
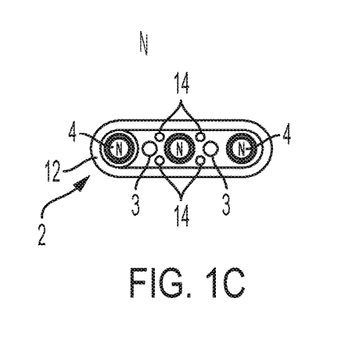
FIG. 1C is an end view of the bottom of the sputtering cathode shown in FIG. 1B.
Figure 1D:
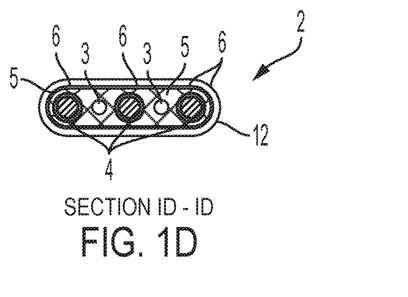
FIG. 1D is a section taken along lines ID-ID in FIG. 1B.
Figure 1E:
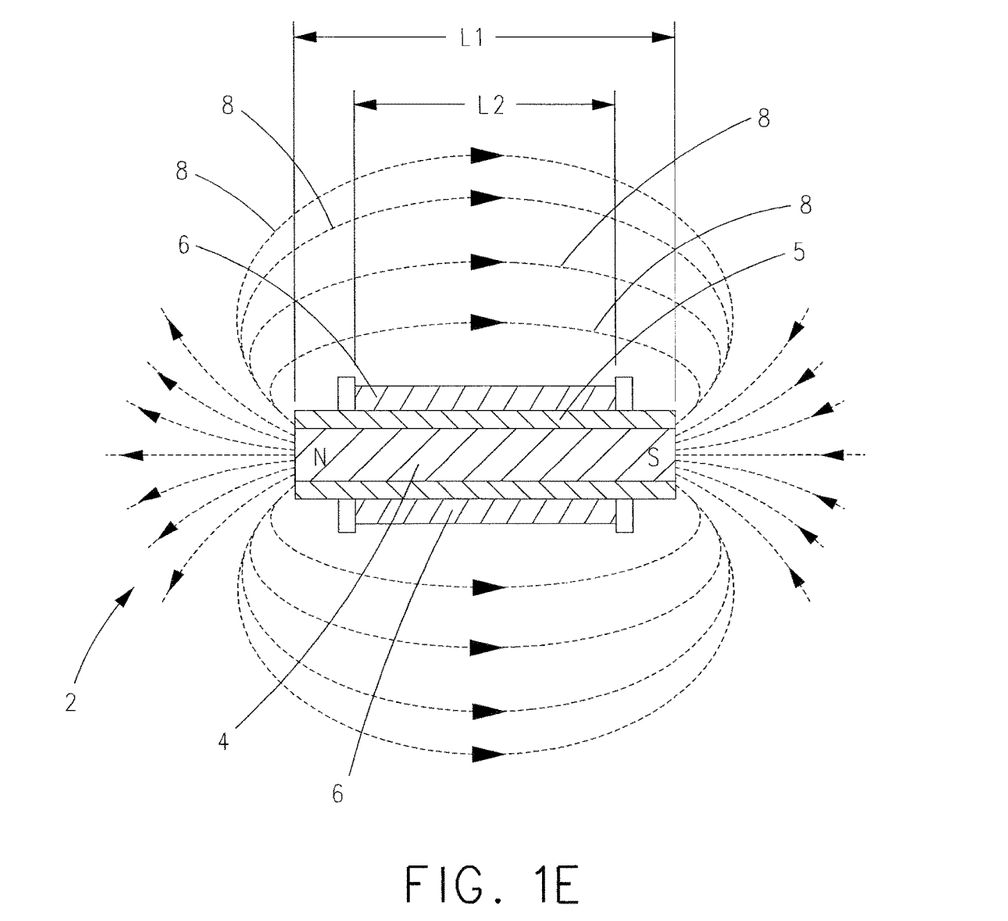
FIG. 1E is a section taken along lines IE-IE in FIG. 1B.

In the example oblong, oval, or racetrack-shaped sputtering cathode 2 shown in FIG. 1A, magnetic field lines 8 can run the length L2 of sputtering target 6 along the flat and arcuate/curved surfaces of sputtering target 6.

Figure 3:
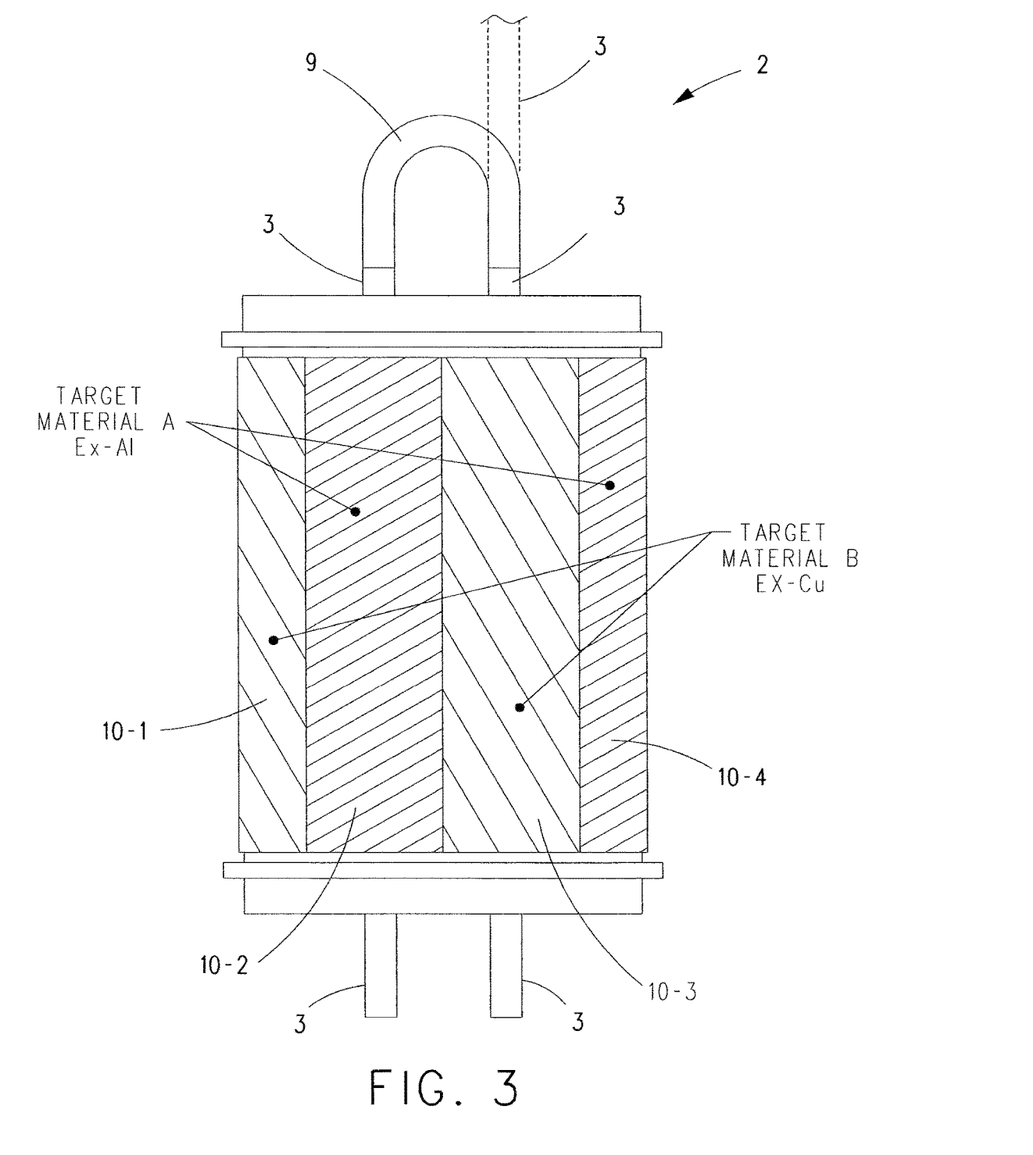
FIG. 3 is a plan view of the sputtering cathode shown in FIG. 1A including a sputtering target formed from a number of flat and curved pieces or tiles, wherein each piece or tile can be formed of the same material, a different material, or the pieces or tiles can be formed from any one or combination of materials.
Figure 4A:
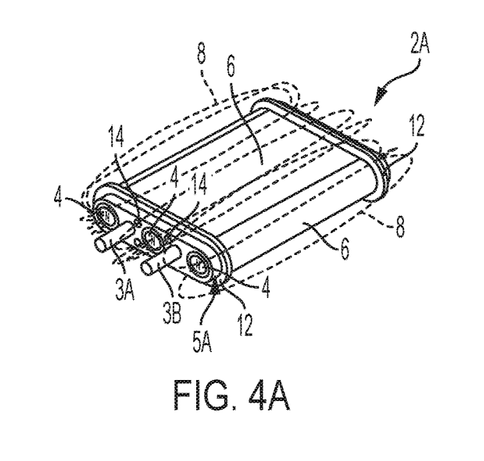
FIG. 4A is a plan view of a sputtering cathode in accordance with another embodiment of the present inventions.
Figure 4B:
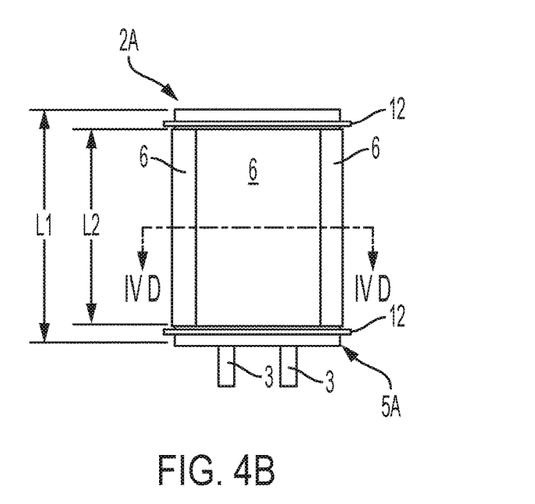
FIG. 4B is a plan view of the sputtering cathode shown in FIG. 4A.
Figure 4C:
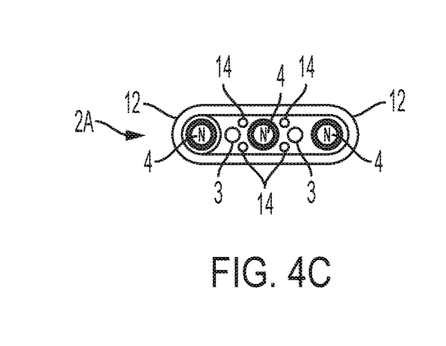
FIG. 4C is an end view of the bottom of the sputtering cathode shown in FIG. 4B.
Figure 4D:
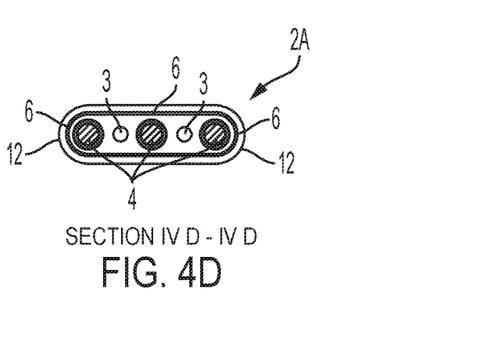
FIG. 4D is a section taken along lines IVD-IVD in FIG. 4B.

With reference to FIG. 3 and with continuing reference to all previous figures, in an example, sputtering target 6 can be manufactured in small pieces or tiles 10 that are attached to the flat and curved sections of former 5 to effectively create a larger surface area than each piece or tile itself. Thus, the material forming sputtering target 6 can extend completely around the outside of former 5, and hence, surround the elongated body of the one or more magnets 4, whereupon, the material forming sputtering target 6 can be sputtered in any direction normal or substantially normal to the face of the materials forming sputtering target 6.

In another example shown in FIG. 3, the pieces or tiles 10 of material forming sputtering target 6 can be formed of different materials to create alloys of sputtered materials. In the example shown in FIG. 3, sputtering target 2 includes pieces or tiles 10-1, 10-2, 10-3, and 10-4 made of material A, material B, material A, and material B, respectively. In an example, material A is aluminum (Al) and material B is copper (C). However, this is not to be construed as limiting the invention. Moreover, it is envisioned that pieces or tiles 10-1 and 10-2 can be made of material A while pieces or tiles 10-3 and 10-4 can be made from material B. The use of multiple pieces or tiles 10 of any one or combination of materials is also envisioned.

In an example, former 5 can be formed from a solid piece of, for example, aluminum with apertures for receiving the one or more magnets 4 therein. In another example, sputtering target 6 can be formed in a manner to incorporate the functions of former 5. Stated differently, former 5 can be manufactured of the intended material to form sputtering target 6 and utilized at sputtering target 6. In this latter example, the function of former 5 is merged into sputtering target 6.

The example sputtering cathode shown in FIGS. 1A-1D includes a plurality of magnets 4 positioned side-by-side in spaced relation in a plane. In an example, the longitudinal axes of the plurality of magnets 4 of sputtering cathode 2 extend in the same direction. In a more particular example, the longitudinal axes of the plurality of magnets 4 of sputtering cathode 2 are parallel. While the sputtering cathode 2 shown in FIGS. 1A-1D includes a plurality (three) of magnets 4 position side-by-side in spaced relation in a plane, it is envisioned that when viewed from one of the ends of sputtering cathode 2, the plurality of magnets 4 can be positioned in a plane (see e.g., FIGS. 1A, 1C, 1D), a circle, polygon, or hexagonal shape (see e.g., FIG. 2B), a rectangular or square shape (see e.g., FIGS. 2A and 2D), or a triangle shape (see e.g., FIG. 2C).

In an example, one or more cooling tube 3 can extend through former 5 or through sputtering target 6 in the case where the function of former 5 is merged into sputtering target 6. In one example, sputtering target 2 can include a single cooling tube 3 that extends through sputtering cathode 2 whereupon cooling fluid (such as water) introduced into one end of cooling tube 3 exits sputtering cathode 2 via the other end of cooling tube 3 (as shown in phantom at the top of FIG. 3). In another example (FIGS. 1A and 1B), sputtering cathode 2 can include a pair of cooling tubes 3 that extend through sputtering cathode 2. At one end of sputtering cathode 2 a coupler 9 can couple the pair of cooling tubes 3 together to form a closed loop cooling circuit. In this example, fluid (such as water) introduced into one cooling tube 3 flows through coupler 9 and exits through the other cooling tube 3.

With reference to FIGS. 4A-4D and with continuing reference to all previous figures, another example sputtering cathode 2A can include a former 5A which has a hollow interior but which otherwise performs the same function as former 5. Alternatively, former 5A can be manufactured of the intended material to form sputtering target 6 and utilized as sputtering target 6. Stated differently, sputtering target 6 can be made in a way that incorporates the function of former 5A. In this latter example, the functions of former 5A is merged into sputtering target 6 which has a hollow interior. In sputtering cathode 2A, the one or more magnets 4 can be supported adjacent their ends within the hollow interior of sputtering target 6.

In an example, sputtering cathode 2A can include a cooling fluid input tube 3A coupled to one end of sputtering cathode 2A and a cooling fluid output tube 3B coupled to the same end or opposite end of sputtering cathode 2A. In this example, cooling fluid flows into the hollow interior of sputtering cathode 2A via cooling fluid input tube 3A and exits sputtering cathode 2A via cooling fluid output tube 3B.

In an example, either embodiment sputtering cathode 2 or 2A can include flanged ends or wings 12 that may or may not be biased to the same potential (voltage) as sputtering target 6 of sputtering cathode 2 or 2A to aid in plasma confinement.

In an example, one or both ends of sputtering cathode 2 or 2A can include power connections 14 of any suitable and/or desirable form for connection of power leads coupled to a power supply 20 (FIG. 5) utilized to bias either example sputtering cathode 2 or 2A to the potential of a cathode in a physical vapor deposition (PVD) system.

Figure 5:
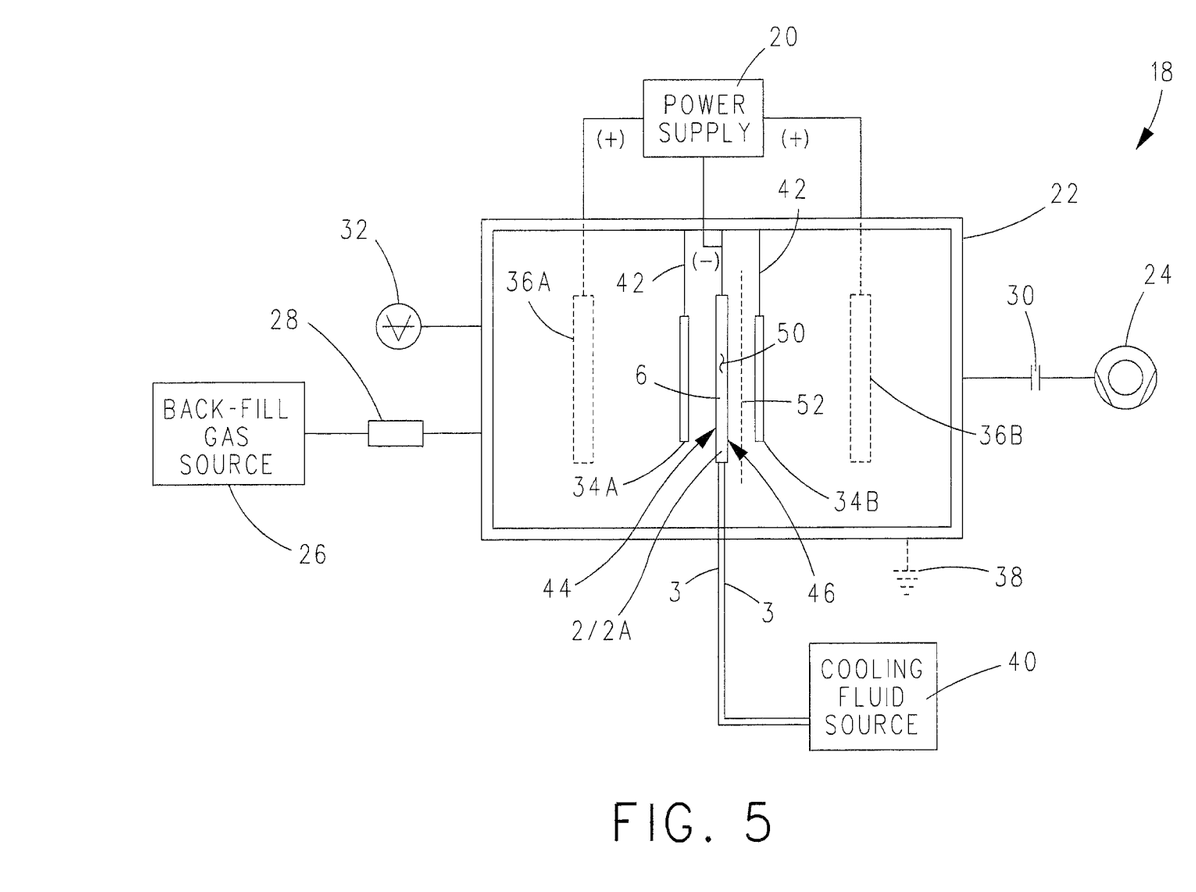
FIG. 5 is a schematic of a physical vapor deposition (PVD) system that can use any of the embodiment sputtering cathodes disclosed herein.

With reference to FIG. 5 and with continuing reference to all previous figures, sputtering target 2 or 2A can be used for sputtering in a physical vapor deposition (PVD) system 18 and process. In an example, PVD system 18 includes a vacuum enclosure 22 that can be sealed from ambient atmosphere to allow ambient atmosphere (ambient air) to be removed from vacuum enclosure 22 via a pumping system 24. Once vacuum enclosure 22 has been evacuated, vacuum enclosure 22 can be back-filled with one or more application-appropriate (inert or reactive) process gas(es) from a back-fill gas source 26 at a pressure to allow plasma generation. Back-fill gas flow can be controlled by a mass flow controller 28. Adequate pressure of the back-fill gas within vacuum enclosure 22 can be maintained by controlling a gate or throttling valve 30 coupled between vacuum enclosure 22 and pumping system 24 via an output signal from a pressure gauge 32.

Sputtering target 2 or 2A can be mounted inside vacuum enclosure 22 to sputter material from sputtering target 6 onto one or more substrates 34A and/or 34B disposed in operative relation to sputtering cathode 2.

As shown in FIG. 5, a negative terminal of power supply 20 is coupled to sputtering cathode 2 or 2A acting as the cathode of PVD system 18 to bias sputtering cathode 2 or 2A to an appropriate potential for sputtering events. One or more positive terminals of power supply 20 can be coupled to vacuum enclosure 22 which, in an example, can act as an anode of PVD system 18. In this example, the one or more positive terminals of power supply 20 can bias vacuum enclosure 22 to an appropriate anode potential relative to the potential that the negative terminal of power supply 20 biases sputtering cathode 2 or 2A whereupon vacuum enclosure 22 acts in the capacity as an anode of PVD system 18. In another example, vacuum enclosure 22 acting in the capacity as an anode of PVD system 18 can be coupled to a ground reference 38 (shown in phantom) and the positive terminal(s) of power supply 20 can be unconnected to vacuum enclosure 22.

In another example, one or more anode elements 36A and/or 36B (shown in phantom in FIG. 5) can be coupled to the one or more positive terminals of power supply 20 in a manner whereupon said one or more anode elements 36A and/or 36B are electrically isolated from vacuum enclosure 22 which, in this example, can be coupled to ground reference 38 (shown in phantom).

As shown in FIG. 5, each substrate 34 can be positioned between sputtering cathode 2 or 2A acting as a cathode of PVD system 18 and either vacuum enclosure 22 or an anode element 36 acting as an anode of PVD system 18. FIG. 5 also shows a cooling fluid source 40 coupled to cooling tubes 3 of sputtering cathode 2 or 2A.

In FIG. 5, a substrate 34A is positioned on one side (the left side in FIG. 5) of the sputtering cathode 2 or 2A in spaced opposition to the front side 44 of sputtering cathode 2 or 2A, and a substrate 34B is positioned on the other side (the right side in FIG. 5) in spaced opposition to the back side 46 of sputtering cathode 2 or 2A. However, this is not to be construed as limiting the invention since sputtering cathode 2 or 2A be utilized to sputter material on a single substrate, e.g., a 34A, positioned only on one side of the sputtering cathode.

PVD system 18 can include one or more devices 42 coupled between vacuum enclosure 22 and one or more substrates 34 for moving said one or more substrates 34 relative to the outward facing surface(s) of sputtering target 6 of sputtering cathode 2 or 2A acting as a cathode for improved sputtering uniformity or continuous sputtering coating applications. This motion can be linear, rotary, or a combination thereof.

Benefits of the sputtering cathodes 2 and 2A disclosed herein having one or more flat and/or one or more curved or arcuate surfaces (for example, the oval, oblong, or racetrack-shaped cross-sectional sputtering cathode 2 and 2A shown in FIGS. 1A-1D and FIGS. 4A-4D, or the round, polygon, hexagonal, triangular, rectangular, and square sputtering cathodes 2 shown in FIGS. 2A-2D), is that the design of said sputtering cathode 2 or 2A allows plasma to be created at all points or substantially all points around the material forming sputtering target 6 of sputtering cathode 2 or 2A. Thus, the example, sputtering target 2 or 2A shown in FIGS. 1A-1D or FIGS. 4A-4D can be used to sputter coat one or more substrates 34 passing by any one or combination of sides 44, 46, 48, and/or 50 of sputtering cathode 2 or 2A. Sputtering cathode 2 or 2A can also be tailored in both length, width, and/or geometry (as shown for example in the figures) to meet the needs of various coating applications and to optimize material utilization.

In applications where sputtering from only one side of sputtering cathode 2 or 2A is desired, sputtering target 6 can include a desired sputtering material on one side of sputtering cathode 2 or 2A (e.g., the front side 44) while a sacrificial material (such as AL or a low sputter yield material such as C) can be used as the material of sputtering target 6 on the other sides (46, 48, 50) of sputtering cathode 2 or 2A. In an example, a shield or catch basin 52 (shown in phantom in FIG. 5) can be positioned within vacuum enclosure 22 to receive materials sputtered from sputtering cathode 2 not intended to be deposited on a substrate 34.

As can be seen, disclosed herein are example sputtering cathodes including at least one magnet having an elongated body of length L1 defining a north magnetic pole at a first end of the body and a south magnetic pole at a second, opposite, end of the body. An elongated sputtering target of length L2 surrounds the elongated body of the at least one magnet, but not the first and second ends of the magnet. Magnetic field lines produced by the at least one magnet extend in a direction of length L2 along an outward facing surface of the elongated sputtering target.

In an example, length L2 can be ≤ length L1. In another example, length L2 can be between three-quarters of length L1 and the full length L1, i.e., $(0.75 \cdot L1) \leq L2 \leq L1$.

In an example, the elongated sputtering target can be made from a single material. In another example, the elongated sputtering target can be comprised of multiple pieces or tiles of material, where each piece or tile can be made from the same material, or different materials, or any combination of the same and different materials.

In an example, the sputtering cathode can include a plurality of magnets surrounded by the elongated sputtering target. The north magnetic poles of the plurality of magnets can be oriented facing a first direction and the south magnetic poles of the plurality of magnets can be oriented facing in a second, opposite, direction.

In an example, the plurality of magnets can be positioned side-by-side in spaced relation in a plane. In an example, the longitudinal axes of the plurality of magnets can extend in the same direction. In another example, the longitudinal axes of the plurality of magnets can be parallel.

When viewed from one of the pole ends of the plurality of magnets, the plurality of magnets can be positioned in one of: a plane, a circle, a rectangle, a square, a triangle, or a polygon.

In an example, the material forming sputtering target can support the one or more magnets. In another example, a former can be included between the one or more magnets and the sputtering target. In an example, a cooling tube can pass fluid into the sputtering cathode, out from the sputtering cathode, or through the sputtering cathode. In another example, the cooling tube can extend through the sputtering cathode in the same direction as a longitudinal axis of one or more of the magnets.

In an example, in cross-section, the elongated sputtering target can have one of the following shapes: oblong, oval, race-track, round, polygon, hexagonal, triangle, rectangle, or square.

A method of forming a sputtering cathode can include providing an elongated magnet of axial length L1 defining north and south magnetic poles at opposite ends of length L1. An axis of the elongated magnet, but not the ends of the magnet, can be surrounded with an elongated sputtering target of length L2. In an example, magnetic field lines produced by the magnet can extend in a direction of length L2 along an outward facing surface of the elongated sputtering target.

Finally, a physical vapor deposition system is disclosed comprising an enclosure, one of the sputtering cathodes described above disposed in the enclosure, and a power supply having a negative terminal coupled to the sputtering cathode and a positive terminal connected either to the enclosure or to an anode disposed in the enclosure.

The present invention has been described with reference to the accompanying figures. Obvious modifications and alterations will occur to others upon reading and understanding the preceding detailed description. For example, while the figures show magnets 4 as having elongated cylindrical shapes, this is not to be construed as limiting the invention since it is envisioned that each magnet 4 can have any shape deemed suitable and/or desirable by one skilled in the art, such as, without limitation, square, rectangular, half-round, etc. It is intended that the invention be construed as including all such modifications and alterations insofar as they come within the scope of the appended claims or the equivalents thereof.

The invention claimed is:

1. A sputtering cathode comprising:
    a magnet having a body of length L1 defining a north magnetic pole at a first end of the length L1 and a south magnetic pole at a seonc, opposite end of the length L1; and
    a sputtering target of length L2 surrounding the body of the magnet, but not ends of the magnet, wherein lengths L1 and L2 extend in the same direction.

2. The sputtering cathode of claim 1, wherein magnetic field lines produced by the magnet extend in a direction of length L2 along an outward facing surface of the sputtering target.

3. The sputtering cathode of claim 1, wherein (0.75·L1)≤L2≤L1.

4. The sputtering cathode of claim 1, wherein the sputtering target is made from a single material.

5. The sputtering cathode of claim 1, wherein:
    the sputtering target is comprised of multiple pieces of material; and
    each piece is made from the same material.

6. The sputtering cathode of claim 1, wherein:
    the sputtering target is comprised of plural pieces of material; and
    each piece is made from a different material.

7. The sputtering cathode of claim 1, further including a plurality of magnets surrounded by the sputtering target.

8. The sputtering cathode of claim 7, wherein:
    the north magnetic poles of the plurality of magnets are oriented facing a first direction; and
    the south magnetic poles of the plurality of magnets are oriented facing a second, opposite direction.

9. The sputtering cathode of claim 7, wherein the plurality of magnets is positioned side-by-side in spaced relation, in a plane.

10. The sputtering cathode of claim 9, wherein longitudinal axes of the plurality of magnets extend in the same direction.

11. The sputtering cathode of claim 10, wherein longitudinal axes of the plurality of magnets are parallel.

12. The sputtering cathode of claim 8, wherein, when viewed from one of pole ends of the plurality of magnets, the plurality of magnets is positioned in one of: a plane; a circle; a rectangle, a square, a triangle, or a polygon.

13. The sputtering cathode of claim 1, further including a former between the magnet and the sputtering target.

14. The sputtering cathode of claim 1, further including a cooling tube for passing fluid into the sputtering cathode, out from the sputtering cathode, or through the sputtering cathode.

15. The sputtering cathode of claim 14, wherein the cooling tube extends through the sputtering cathode in the same direction as a longitudinal axis of the magnet.

16. The sputtering cathode of claim 1, wherein, in cross-section, the sputtering target has one of the following shapes: oblong, oval, racetrack, round, polygon, hexagon, triangle, rectangle, or square.

17. A method of forming a sputtering cathode comprising:
    (a) providing a magnet of axial length L1 defining north and south magnetic poles at opposite ends of the length L1; and
    (b) surrounding an axis of the magnet, but not the ends of the magnet, with a sputtering target of length L2, wherein lengths L1 and L2 extend in the same direction.

18. The method of claim 17, wherein (0.75·L1)≤L2≤L1.

19. The method of claim 17, wherein magnetic field lines produced by the magnet extend in a direction of length L2 along an outward facing surface of the sputtering target.

20. A physical vapor deposition system comprising:
    an enclosure;
    the sputtering cathode of claim 1 in the enclosure; and
    a power supply having a negative terminal connected to the sputtering cathode, wherein the enclosure is connected to a positive terminal of the power supply or to a reference ground and operates as an anode of the system.

* * * * *